United States Patent [19]

Harnack

[11] 4,244,753
[45] Jan. 13, 1981

[54] METHOD FOR PURIFICATION OF II-VI CRYSTALS

[75] Inventor: Phyllis M. Harnack, Hastings-on-Hudson, N.Y.

[73] Assignee: North American Philips Corporation, New York, N.Y.

[21] Appl. No.: 106,562

[22] Filed: Dec. 26, 1979

[51] Int. Cl.³ .......................................... H01L 21/388
[52] U.S. Cl. .................................... 148/1.5; 75/20 R; 75/86; 148/1; 148/13.1; 148/20.6; 148/171; 148/191
[58] Field of Search ................. 148/1, 1.5, 13.1, 20.6, 148/171, 191, 188; 75/20 R, 86

[56] References Cited

U.S. PATENT DOCUMENTS

| 3,146,204 | 8/1964 | Aven | 148/188 X |
| 3,549,434 | 12/1970 | Aven | 148/188 X |
| 3,670,220 | 6/1972 | Kun et al. | 148/1.5 X |
| 3,771,970 | 11/1973 | Hemmat | 148/1.5 X |
| 3,925,108 | 12/1975 | Woodbury | 148/1.5 X |

OTHER PUBLICATIONS

Aven et al., *Applied Physics Letters,* vol. 1, No. 3, Nov. 1962, pp. 53–54.

Primary Examiner—G. Ozaki
Attorney, Agent, or Firm—Norman N. Spain

[57] ABSTRACT

A method for purification of Group II-VI crystals by contacting with a zinc melt.

4 Claims, 3 Drawing Figures

METHOD FOR PURIFICATION OF II-VI CRYSTALS

BACKGROUND OF THE INVENTION

This invention relates to a new and improved method for the purification of II-VI crystals. The preparation of such II-VI compounds as ZnTe, ZnSe, ZnS, and CdS by such well known techniques as melt growth or vapor-phase growth techniques are well known in the art.

In either case the materials are in contact with refractory container materials at high temperatures for considerable lengths of time and thus are subject to contamination by diffusion of impurities from the container material into the crystal. As a result these materials are frequently unsuitable for controlled doping.

An attempt to overcome this problem was reported by M. Aven et al, Applied Physics Letters, Vol. 1, No. 3, Nov. 1, 1962, pages 53-54. In this method the II-VI crystal, such as ZnTe or ZnSe, was purified by sealing the crystal, together with a solvent for the impurity, in a small quartz tube under vacuum and heating it for a time sufficient to establish equilibrium between the solid and the liquid phases. Thus, for ZnTe a molten zinc solvent was employed. Temperatures of between 900° and 1000° C. and firing times of between one to two days were employed. Although this method results in crystals of improved purity, contamination results from diffusion from the quartz. Further this method has a disadvantage in that the wafers to be employed as substrates have to be sliced from these crystals and during the slicing procedure frequently contamination results.

It is an object of this invention to provide a method for the purification of II-VI semiconductive materials in which substrates of improved purity are produced.

It is a further object of this invention to provide a method for purification of II-VI substrates in which the substrate may be immediately used in a doping operation.

These and other objects of the invention will be apparent from the description that follows.

GENERAL DESCRIPTION OF THE INVENTION

According to the invention I have developed a new and novel method of purifying II-VI crystals.

In the method of the invention the purification of the substrate takes place directly in the same graphite boat which may also be employed for epitaxial deposition.

More particularly, according to the invention, I apply a heated melt of the desired solvent to the upper surface of the II-VI crystal to be purified in a high purity graphite reactor such as a high purity graphite boat. After the crystal is in contact with the melt for the desired length of time, I move the crystal through the boat and physically wipe the contaminated solvent from the upper surface of the crystal. The purified crystal may then be moved to a second chamber in the boat for epitaxial growth or removed completely from the graphite boat.

In a preferred embodiment of my invention, the II-VI crystal is sliced into wafer form and the wafers are then subjected to the purification method of my invention.

By this method I have found that the crystal wafer may be purified in a more uniform and faster method than can be obtained when the crystal is sliced after purification. Further, by this method, contamination of the crystal by diffusion from a quartz ampule is eliminated.

The method of the invention is applicable to such crystals as ZnTe, ZnSe, and CdS. For ZnTe, ZnSe, molten zinc or a mixture of zinc with a metal such as bismuth or tin is generally used as a solvent. For ZnSe a temperature range of 600° C. to 900° C. is employed. Similar temperature ranges are used for the other crystals. The time of exposure of the crystal to the melt range from 0.5-16 hours.

The purified II-VI crystals may be subjected to additional processing after being removed from the reactor, or the purified crystals, after being subjected to epitaxial growth in the reactor, may be used for lasers or light emitting diodes.

DETAILED DESCRIPTION OF THE INVENTION

The method of the invention will now be described in greater detail with reference to the accompanying drawing.

Figure 1:
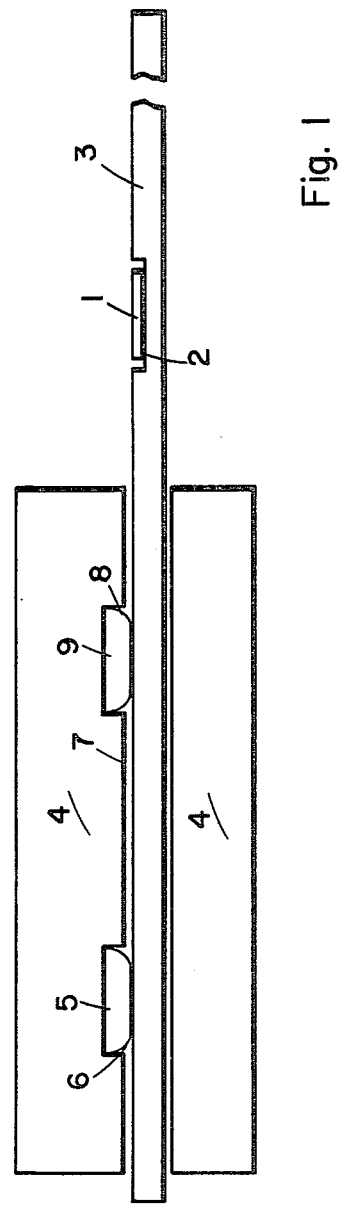
FIG. 1 is a cross-sectional view of an apparatus suitable for carrying out the method of the invention.

As shown in FIG. 1 of the drawing, a ZnSe wafer 1 is positioned in sample well 2 of a graphite slider 3. The slider 3 is then slid into graphite boat 4 until the surface of the ZnSe wafer 1 comes into contact with extraction melt 5 formed of molten zinc contained in melt chamber 6 and heated to 800° C.

The ZnSe wafer 1 is kept in contact with the molten zinc for 2 hours. The wafer is then drawn through the graphite boat 4 while the upper surface of the wafer 1 is drawn along scraper surface 7 of the boat 4 where the contaminated solvent is scraped away from the upper surface of the wafer 1. The purified wafer is then directly removed from the boat 4 by the slider 3.

Figure 2:
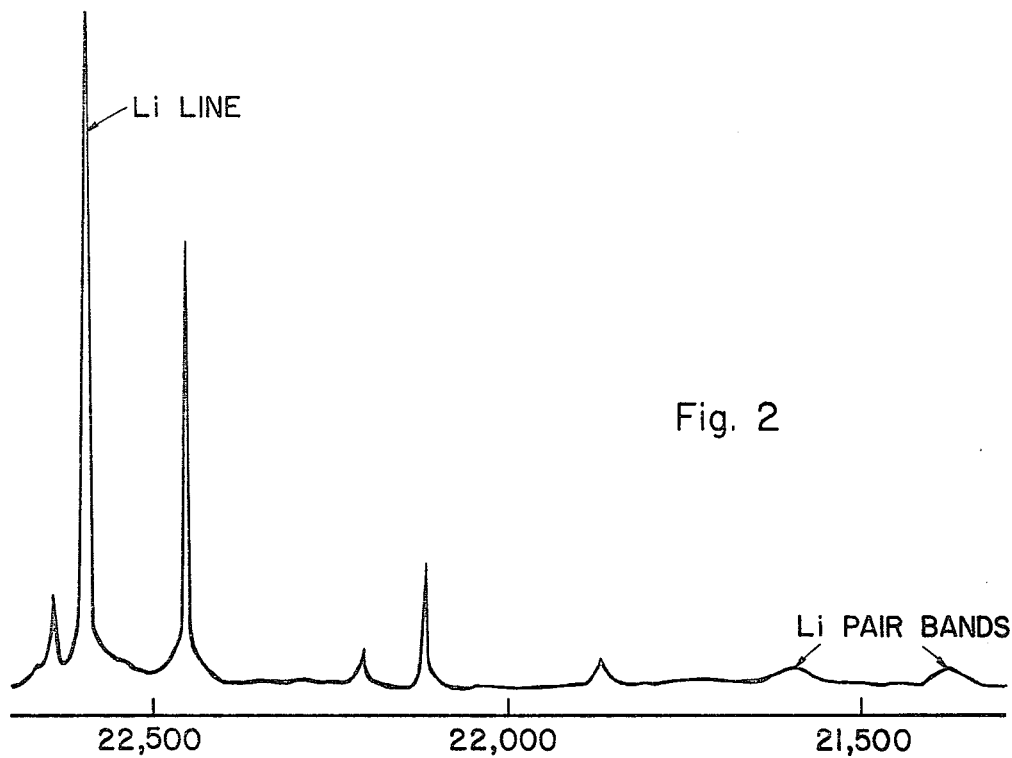
FIG. 2 is a curve of the photoluminescent spectra of a ZnSe crystal before purification by the invention and FIG. 3 is a curve of the photoluminescent spectra of the same crystal after purification by the method of the invention.
Figure 3:
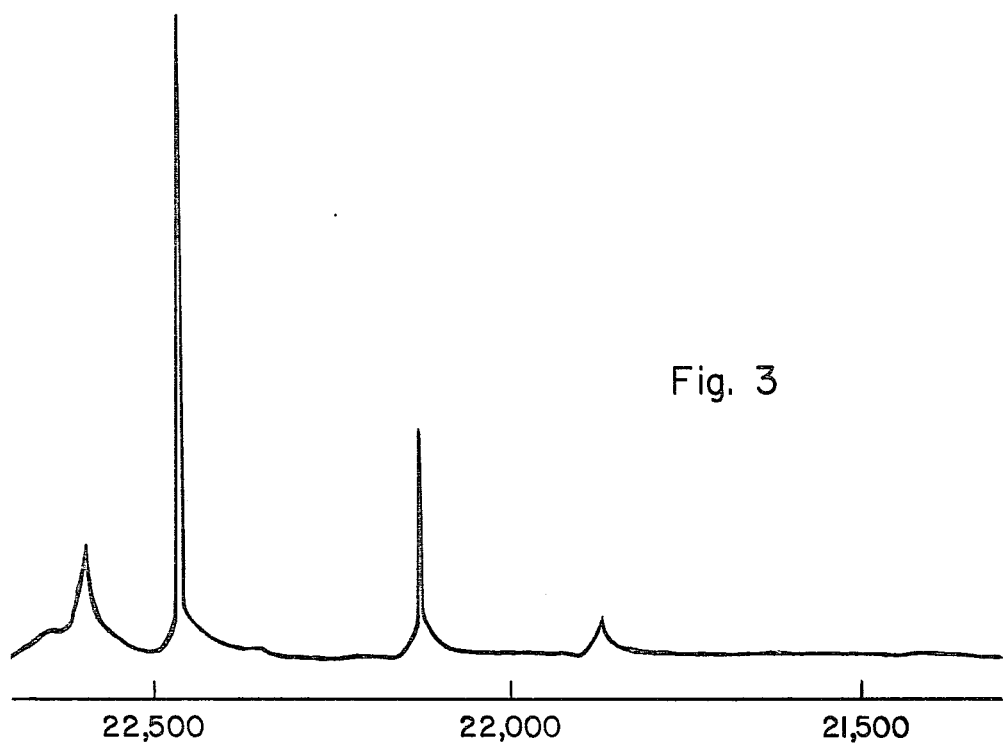

The high degree of purification of the wafer by the method of this invention is clearly demonstrated by a comparison of FIGS. 2 and 3 of the drawings. FIG. 2 and FIG. 3 are curves of the photoluminescent data of the ZnSe wafer 1 before and after treatment in the graphite boat. As seen in FIG. 3 there is no evidence of Li line at 22,520 cm$^{-1}$ or the Li pair spectra near 21,500 cm$^{-1}$ which are present before treatment as shown in FIG. 2.

While in the instant example, the purified wafer was directly removed from the graphite boat without being subjected to epitaxial growth the purified wafer may be positioned under melt chamber 8 for subjection to epitaxial growth from an epitaxial melt 9 contained therein.

In the case where growth of an epitaxial layer is required, the temperature of the boat is raised to the desired growth temperature (800°-1000° C.) before the crystal is moved from the extraction melt to the epitaxial melt in chamber 8. The epitaxial melt consists of a solvent, such as Bi, Sn, Sb (or any other suitable low melting metal), which contains Zn, Se and sometimes an impurity dopant, such as P, As, or Al. During the growth cycle the temperature is slowly lowered at approximately 0.5° C./min. over a range of 100° C. The resultant doped crystal is then moved out of the boat, the epitaxial melt being wiped off of the crystal by the scraper surface of the boat.

While I have described various embodiments of my invention it is to be understood that these embodiments are merely illustrative of my invention and that various changes may be made in the embodiments of my invention which are within the full intended scope of the invention as defined by the following claims.

What I claim is:

1. A method for the purification of a II-VI crystal comprising placing a said crystal in a graphite reactor, subjecting a surface of said crystal to the action of a melt capable of removing undesired materials from said crystal, and then physically removing the resultant contaminated melt from the surface of said crystal while said crystal remains in said graphite reactor.

2. The method of claim 1 wherein the crystal is held in contact with said melt from 0.5-16 hours while said melt is heated to from 600° C. to 900° C.

3. The method of claim 2 wherein said crystal is in wafer form.

4. The method of claims 2 or 3 wherein the crystal is ZnSe and the melt is molten zinc.

* * * * *